United States Patent
Freund et al.

[19]

[11] Patent Number: 6,131,263
[45] Date of Patent: Oct. 17, 2000

[54] METHOD AND APPARATUS FOR RELEASING LASER BARS AFTER FACET COATING

[75] Inventors: Joseph Michael Freund, Fogelsville; George John Przybylek, Douglasville; Dennis Mark Romero, Allentown, all of Pa.

[73] Assignee: Lucent Technologies Inc., Murray Hill, N.J.

[21] Appl. No.: 09/179,171

[22] Filed: Oct. 26, 1998

[51] Int. Cl.⁷ .................................................. B23P 19/00
[52] U.S. Cl. .......................... 29/426.5; 29/426.6; 29/239; 29/253
[58] Field of Search .................. 29/426.6, 426.5, 29/239, 253

[56] References Cited

U.S. PATENT DOCUMENTS

| | | | |
|---|---|---|---|
| 893,319 | 7/1908 | Gillespie et al. | |
| 3,839,781 | 10/1974 | Russell | 29/574 |
| 3,846,895 | 11/1974 | Cosham | 29/203 |
| 3,962,655 | 6/1976 | Selway | 331/94.5 |
| 4,822,755 | 4/1989 | Hawkins | 437/227 |

*Primary Examiner*—Irene Cuda
*Assistant Examiner*—Anthony L. Green
*Attorney, Agent, or Firm*—Darby & Darby

[57] ABSTRACT

A slot is formed behind each face of a stackable laser bar spacer of the type having a laser bar supporting face and a lower face for contacting a laser bar therebelow, each slot being generally parallel to the face in front of it and being located near an edge thereof. This produces a thin, flap-like portion at an end of each face. When it is desired to release a stuck laser bar from a face, this flap portion is caused to flex in the direction of the laser bar. The laser bar, being relatively inflexible, will be lifted away from the corresponding face, breaking free thereof. The stacked spacers may then be separated and the laser bars removed therefrom.

5 Claims, 2 Drawing Sheets

METHOD AND APPARATUS FOR RELEASING LASER BARS AFTER FACET COATING

FIELD OF THE INVENTION

The present invention relates generally to integrated circuit processing and, more particularly, concerns a method and apparatus used during the manufacture of laser devices to release stuck laser bars after facet coating.

BACKGROUND OF THE INVENTION

Integrated circuit laser devices are manufactured on wafers which are two inches in diameter and about 12–20 mils thick. After initial manufacture, the wafers are thinned to about 3.5–4.5 mils and separated into smaller units, called sections, with four sections being derived from a single wafer. The sections are trimmed in one dimension, which we will call length, to be about 0.4 inches long. They are also scored across their widths to form 20–30 subdivisions, called bars, which are about 12 mils wide and about 0.4 inches long. During subsequent processing, the sections are divided into bars by breaking or cleaving them along the scribe lines, to form facets along their elongated sides, and eventually the bars ar cleaved to form individual chips.

Before the laser bars are separated into the individual chips, the cleaved edges or facets are subjected to a coating process. During coating, a plurality of tray-like spacers, stacked in a nested arrangement, are utilized to retain the laser bars in position. Specifically, each laser bar is supported upon an upper face of a spacer, and the spaces are then stacked and retained together by spring pressure so that each laser bar is captured between its supporting surface and the lower surface of the spacer immediately above. The facets are then subjected to a conventional coating process, during which a portion of the coating and material will typically cause the laser bar to stick to one or more of the capturing faces, at the edge. This interferes with the separation of the stacked spacers and the removal of the laser bars therefrom. Unfortunately, the laser bars are rather delicate, so it is not uncommon for them to be damaged during removal efforts. Thus, the removal of stuck laser bars becomes a time consuming and costly process.

In accordance with the present invention, a slot is formed behind each face of a laser bar spacer of the type having a laser bar supporting face and a lower face for contacting a laser bar therebelow, each slot being generally parallel to the face in front of it and being located near an edge thereof. This produces a thin, flap-like portion at an end of each face. When it is desired to release a stuck laser bar from a face, this flap portion is caused to flex in the direction of the laser bar. The laser bar, being relatively inflexible, will therefore be lifted away from the corresponding face, breaking free thereof. The stacked spacers may then be separated and the laser bars removed therefrom.

BRIEF DESCRIPTION OF THE DRAWINGS

The foregoing brief description, as well as other objects, features and advantages of the present invention will be understood more completely from the following detailed description presently preferred, but nonetheless illustrative embodiments, with reference being had to the accompanying drawings in which.

DETAILED DESCRIPTION OF THE PREFERRED EMBODIMENT

Figure 1:
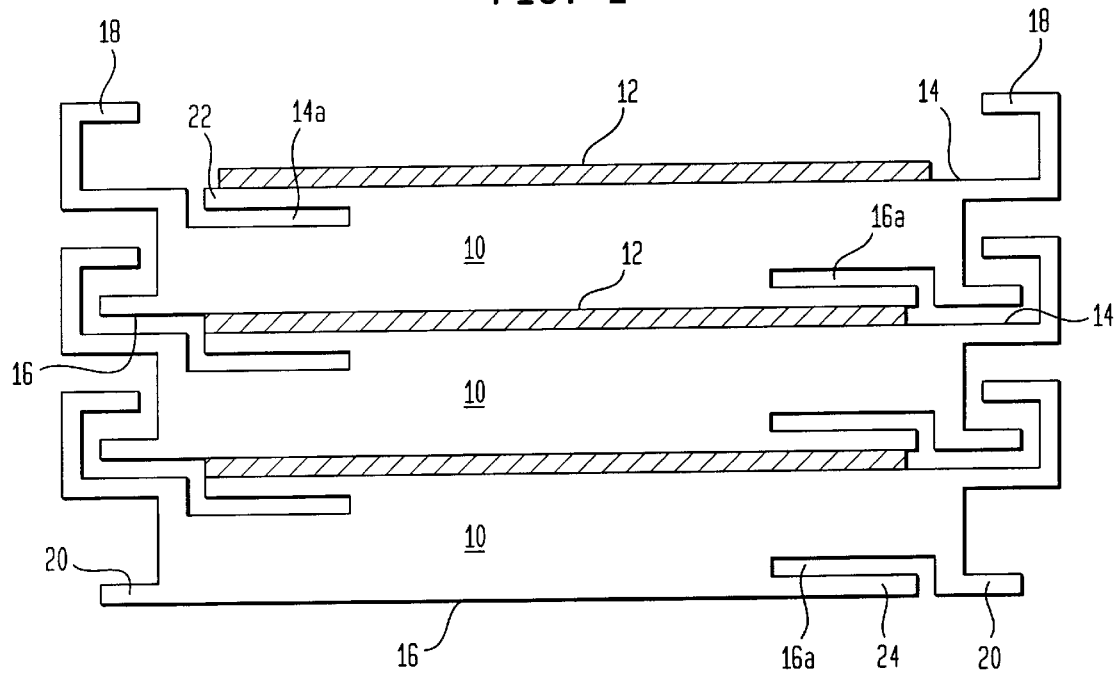
FIG. 1 is a side view illustrating a plurality of laser bars retained between spacers in accordance with a first embodiment of the present invention, ready for the coating process.

Turning now to the drawings, FIG. 1 is a side view illustrating a plurality of laser bar facet coating spacers 10 retaining a plurality of laser bars 12 in position for facet coating. It should be appreciated that the figure illustrates the bottom of a stack of a large number of spacers. The spacers10 would be retained in this position by spring pressure (spring not shown) and, as will be appreciated, with the facets thus exposed, the entire stack of spacers and laser bars may be inserted into conventional equipment for facet coating.

The spacer 10 is preferably made of stainless steel. Each spacer is a tray-like structure with a supporting face 14 for a laser bar 12 positioned lengthwise. Each spacer 10 also includes a lower face 16, which contacts a laser bar below and captures that laser bar between lower face 16 and the support face 14 of the next lower spacer 10. Each spacer also includes a pair of upwardly projecting ears 18, 18, as well as a pair of lateral extension walls 20, 20 of lower surface 16. As will be appreciated from FIG. 1, lateral extensions 20 of each spacer are captured within the ears 18 of the next lower spacer so as to nest the two spacers together. However, a certain amount relative vertical movement would be possible if the spacers were not retained together by spring pressure. The structure defined so far is representative of a conventional laser bar spacer for facet coating.

It should be appreciated that as retained in FIG. 1, when the laser bar 12 is subjected facet coating a certain amount of coating material from the facet along the elongated edge of the bar will adhere to the edge of the upper or lower spacer surfaces 14, 16 causing the laser bars to stick to the upper and/or lower spacer.

In accordance with the embodiment illustrated in FIG. 1, a slot 14a is formed behind support surface 14 at one end thereof. Slot 14a is generally paralleled to surface 14 and extends across its entire width (into the plane of the drawing), forming an end flap portion 22. Similarly, a slot 16a is formed behind surface 16 and at the end thereof to form a flap portion 24.

Figure 2:
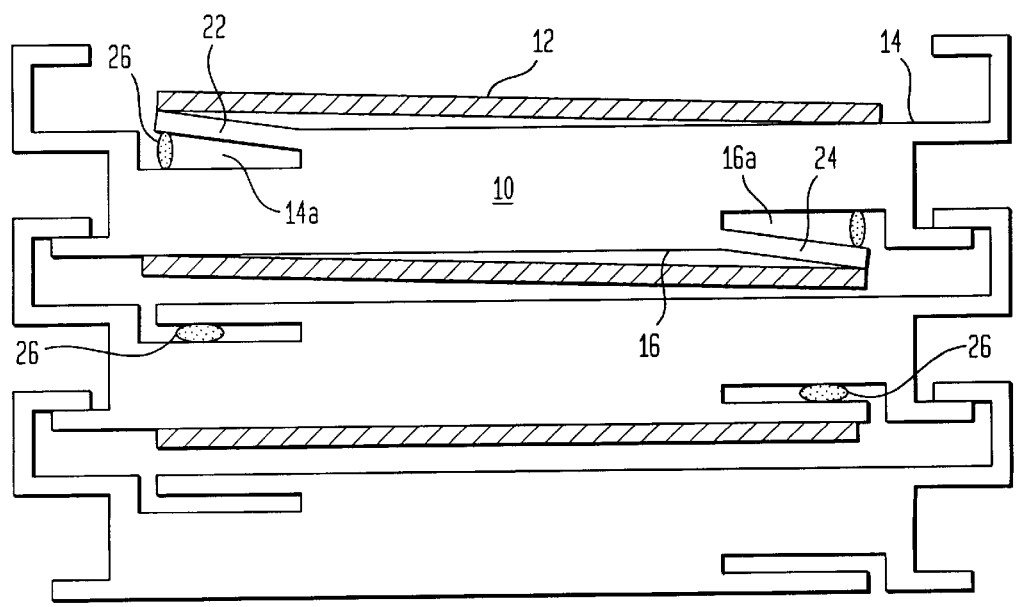
FIG. 2 is a side view similar to FIG. 1 illustrating the removal of stuck laser bars following the coating process.

As best seen in FIG. 2, when it is desired to release a stuck laser bar, a tool 26 having an oblong shape may be inserted into slots 14a and 16a. This tool is designed so that its narrower dimension is small enough to fit within the slot (see the middle spacer in FIG. 2). The tool 26 may then be rotated so as to lift the flaps 22, 24 out of their respective slots (see the upper spacer 10 in FIG. 2). As can be seen, this will cause the laser bar 12 to be lifted away from the respective surface 14, 16 releasing any stuck portions.

Figure 3:
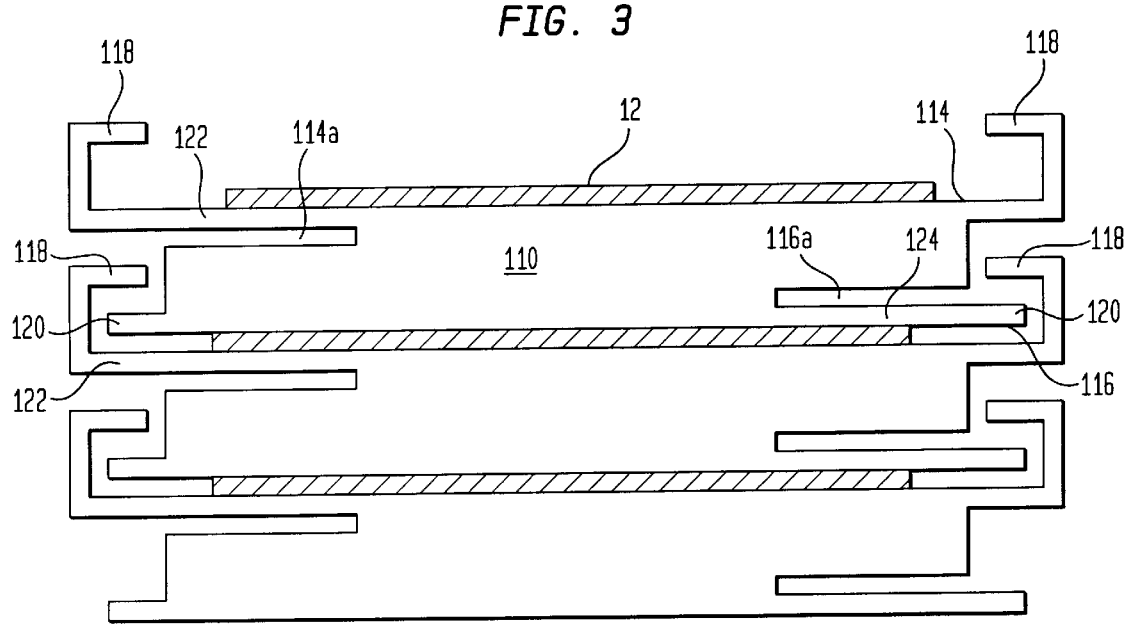
FIG. 3 is a side view similar to FIG. 1 illustrating an alternate embodiment of a spacer in accordance with the present invention, with laser bars retained thereon for facet coating.

FIG. 3 illustrates an alternate embodiment 110 of spacer 10, used to retain a plurality of laser bars 12. In this embodiment, the laser bars are retained between a spacer supporting surface 114 and the lower surface 116 of the spacer next above. In this embodiment, the slot 114a is formed below one of the ear portions 118 to form the flap portion 122. Similarly, a slot 116a is formed above one of the lateral extensions 120 to form a flap 124. The beneficial feature of this embodiment is that no separate tool is needed to flex the flap portions 122, 124. It is only necessary to remove the spring retention of the spacers and apply a force to separate the spacers, e.g. by lifting the top one. The interaction between the ears 118 and the extensions 120 which contact them will then cause all of the flap portions 122, 124 to be flexed. For example, the left hand extension 120 of the uppermost spacer in FIG. 3 will exert an upward force on a corresponding ear portion 118 of the middle spacer which tends to flex the corresponding flap portion 122 upward. Similarly, the right hand ear portion of the middle spacer will exert a downward force on the flap portion 124 of the right hand extension 120, flexing it. As a result, all of the laser bars 12 are separated from all of their contacting surfaces simultaneously by the mere exertion of the spacer separating force.

Figure 4:
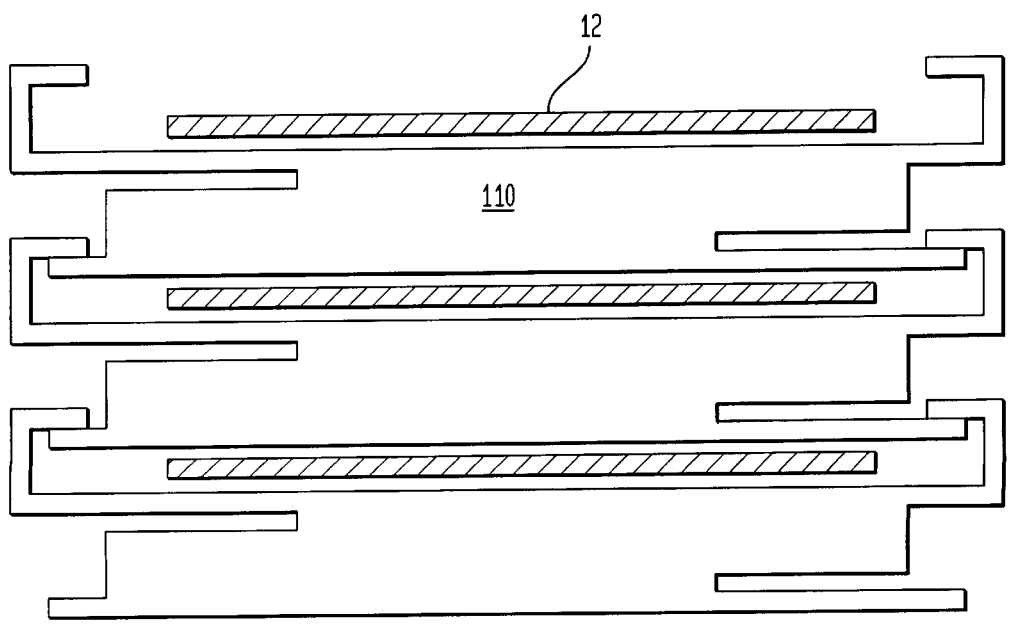
FIG. 4 is a side view similar to FIG. 3 illustrating the laser bars broken free after the spacers have been separated.

FIG. 4 illustrates the spacer arrangement of FIG. 3 after the separating force has been exerted and all of the laser bars 12 have been separated from their respective contacting surfaces. Owing to the automatic nature of the laser bar separation with this embodiment, it should result in substantial savings in time, effort and costs, as well as a reduction in the number of laser bars damaged after the facet coating process.

Although preferred embodiments of the invention have been disclosed for illustrative purposes, those skilled in the art will appreciate that many additions, modifications and substitutions are possible, without departing from the scope and spirit of the invention as defined by the accompanying claims.

What is claimed:

1. A method for separating an integrated circuit structure from a stackable spacer having an integrated circuit structure supporting face, a lower face for contacting an integrated circuit structure on a spacer stacked therebelow, and a slot formed behind one of said faces near a margin thereof so as to define a flexible flap portion behind said one face, said flap portion being moveable out of said slot, said method being used for separating an integrated circuit structure from said one face, said method being performed with the aid of a separation tool having a narrow and wide dimension, the narrow dimension being small enough to fit freely within said slot, the wide dimension being substantially greater than the extent of said slot in a direction away from the corresponding face, said method comprising inserting said tool so it fits freely within the slot and rotating it to force the wide dimension against the flap portion.

2. A method for separating an integrated circuit structure from a stackable spacer of the type having an integrated circuit structure supporting face, a lower face for contacting an integrated circuit structure on a spacer stacked therebelow, and a slot formed behind each of said faces near a margin thereof so as to define a flexible flap portion behind said one face, said flap portion being moveable out of said slot, said method being used for separating an integrated circuit structure from one of said one faces, said method being performed with the aid of a separation tool having a narrow and wide dimension, the narrow dimension being small enough to fit freely within said slot, the wide dimension being substantially greater than the extent of said slot in a direction away from the corresponding face, said method comprising inserting said tool so it fits freely within the slot behind said one face and rotating it to force the wide dimension against the flap portion.

3. A method for separating an integrated circuit structure from a stackable spacer having an integrated circuit structure supporting face, a lower face for contacting an integrated circuit structure on a spacer stacked therebelow, and a slot formed behind one of said faces near a margin thereof so as to define a flexible flap portion behind said one face, said flap portion being moveable out of said slot, a pair of engagement ears formed at opposite ends of said supporting face as extensions thereof which extend laterally outward, upward and back over the supporting surface and a pair of extension walls forming lateral extensions of the lower face at opposite ends thereof and in alignment with said engagement ears, a pair of spacers being placed in stacked alignment by placing the extension walls of one spacer into the engagement ears of a second spacer positioned therebelow, said slot being formed in said spacers immediately below one of said engagement ears, forming said flap portion, said method comprising applying an upright separating force between the spacer and its flap portion and causing said one face and the spacer to separate.

4. A method for separating an integrated circuit structure from a stackable spacer having an integrated circuit structure supporting face, a lower face for contacting an integrated circuit structure on a spacer stacked therebelow, and a slot formed behind one of said faces near a margin thereof so as to define a flexible flap portion behind said one face, said flap portion being moveable out of said slot, a pair of engagement ears formed at opposite ends of said supporting face as extensions thereof which extend laterally outward, upward and back over the supporting surface and a pair of extension walls forming lateral extensions of the lower face at opposite ends thereof and in alignment with said engagement ears, a pair of spacers being placed in stacked alignment by placing the extension walls of one spacer into the engagement ears of a second spacer positioned therebelow, said slot being formed in said spacers immediately below one of said engagement ears, forming said flap portion, and a second slot formed in said spacers immediately behind one of said extension walls, forming a second flap portion, said method comprising applying an upright separating force between the spacer and its flap portion and causing said one face and the spacer to separate.

5. A method for separating an integrated circuit structure from a stackable spacer having an integrated circuit structure supporting face, a lower face for contacting an integrated circuit structure on a spacer stacked therebelow, and a slot formed behind one of said faces near a margin thereof so as to define a flexible flap portion behind said one face, said flap portion being moveable out of said slot, and a pair of engagement ears formed at opposite ends of said supporting face as extensions thereof which extend laterally outward, upward and back over the supporting surface and a Pair of extension walls forming lateral extensions of the lower face at opposite ends thereof and in alignment with said engagement ears a pair of spacers being placed in stacked alignment by placing the extension walls of one spacer into the engagement ears of a second spacer positioned therebelow, said slot being formed in said spacers immediately behind one of said extension walls, forming said flap portion, said method comprising applying an upright separating force between the spacer and its flap portion and causing said one face and the spacer to separate.

* * * * *